United States Patent
Wang et al.

(10) Patent No.: US 7,859,807 B2
(45) Date of Patent: Dec. 28, 2010

(54) ESD PROTECTION CIRCUIT AND METHOD THEREOF

(75) Inventors: Po-Chih Wang, Kaohsiung (TW); Ka-Un Chan, Hsin Chu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 204 days.

(21) Appl. No.: 12/104,019

(22) Filed: Apr. 16, 2008

(65) Prior Publication Data

US 2008/0232010 A1    Sep. 25, 2008

Related U.S. Application Data

(63) Continuation-in-part of application No. 11/723,911, filed on Mar. 22, 2007, now abandoned.

(30) Foreign Application Priority Data

Apr. 17, 2007   (TW) ............................. 96113421 A

(51) Int. Cl.
    *H02H 9/00*    (2006.01)
(52) U.S. Cl. ............................................. 361/56
(58) Field of Classification Search .................. 361/56
    See application file for complete search history.

(56) References Cited

U.S. PATENT DOCUMENTS

| 6,275,089 | B1* | 8/2001 | Song et al. ................... 327/314 |
| 6,577,480 | B1* | 6/2003 | Avery et al. ................... 361/56 |
| 6,624,999 | B1 | 9/2003 | Johnson |
| 6,671,147 | B2* | 12/2003 | Ker et al. ....................... 361/56 |
| 6,768,616 | B2* | 7/2004 | Mergens et al. ................ 361/56 |
| 6,882,512 | B2 | 4/2005 | Castillejo et al. |
| 2003/0076636 | A1* | 4/2003 | Ker et al. ....................... 361/56 |
| 2006/0050453 | A1* | 3/2006 | Duvvury et al. ................ 361/56 |
| 2006/0256489 | A1* | 11/2006 | Ker et al. ....................... 361/56 |
| 2007/0201175 | A1* | 8/2007 | Arai et al. ...................... 361/56 |
| 2008/0123230 | A1* | 5/2008 | Yun .............................. 361/56 |
| 2008/0239599 | A1* | 10/2008 | Yizraeli et al. ................. 361/56 |

* cited by examiner

*Primary Examiner*—Ronald W Leja
(74) *Attorney, Agent, or Firm*—Thomas, Kayden, Horstemeyer & Risley, LLP

(57) ABSTRACT

An electrostatic discharge (ESD) protection circuit and method thereof is provided. The ESD protection circuit includes two clamping circuits, an inductor, a diode and a diode string. In addition to a voltage swing of an output voltage able to get rid of the influence of the ESD protection circuit, the invention reduces an ESD conduction path length and dissipates an ESD current swiftly by installing at least two clamping circuits, which significantly increases the effectiveness of the protection for large-signal circuits.

14 Claims, 8 Drawing Sheets

ESD PROTECTION CIRCUIT AND METHOD THEREOF

CROSS-REFERENCE TO RELATED APPLICATION

This application is a continuation-in-part of application Ser. No. 11/723,911, filed Mar. 22, 2007 now abandoned, which application is incorporated by reference herein in its entirety.

BACKGROUND OF THE INVENTION

1. Field of the Invention

The invention relates to electrostatic discharge (ESD) protection, and more particularly, to an ESD protection circuit and method thereof for large-signal circuits.

2. Description of the Related Art

FIG. 1A is a schematic circuit diagram of a conventional ESD protection circuit. Referring to FIG. 1A, an ESD protection circuit 100 installed at the output terminal of the output circuit 110 includes a clamping circuit 120 and two series-connected diodes $D_{p1}$, $D_{n1}$; meanwhile, both the output circuit 110 and the clamping circuit 120 are coupled between a first operating voltage $V_{dd}$ and a second operating voltage $V_{ss}$. The clamping circuit 120 includes an electrostatic discharge unit 130 and an ESD detecting circuit 140. The electrostatic discharge unit 130 includes a NMOS transistor $T_N$, whereas the ESD detecting circuit 140 includes a resistor $R_1$, a capacitor $C_1$ and an inverter $D_1$.

While an electrostatic current flows to the output circuit 110 through the output pad $P_o$ and voltage sources ($V_{dd}$, $V_{ss}$), the ESD detecting circuit 140 triggers the electrostatic discharge unit 130 to bypass the electrostatic current without damaging the output circuit 110. However, the output voltage of a large-signal circuit or a power amplifier has a DC voltage component of about $V_{dd}$. Under normal operations, the magnitude of the output voltage reaches up to $2 \times V_{dd}$ (i.e., a voltage swing S equal to $V_{dd}$). On condition that there is only one diode $D_{p1}$ installed in the circuit, a voltage drop $V_{dd}$ between $V_{out}$ and $V_{dd}$ will cause the diode $D_{p1}$ to turn on (the turn-on voltage of conventional diodes is approximately 0.7V) and a fraction of the output voltage $V_{out}$ that is greater than ($V_{dd}+0.7V$) will be clipped, as shown in FIG. 1B.

In order to solve the above-mentioned problem, an ESD protection circuit is discussed in U.S. application Ser. No. 11/723,911, filed Mar. 22, 2007 and assigned to Realtek Semiconductor Corporation, a schematic circuit diagram of which is illustrated in FIG. 2. An ESD protection circuit 200, installed at the output terminal of a power amplifier 210, comprises a clamping circuit 120, an inductor L, a diode $D_{n1}$ and a diode string $D_{p1}$~$D_{p5}$. Note that the diode string including five diodes $D_{p1}$~$D_{p5}$ is merely taken for example herein; usually, a number M of diodes in the diode string is greater than or equal to the voltage swing S divided by the turn-on voltage of the diodes. If a positive ESD stress (with respect to $V_{ss}$) appears at the output pad $P_o$, the diode string $D_{p1}$~$D_{p5}$ located between the output pad $P_o$ and the first operating voltage $V_{dd}$ will be switched on and the clamping circuit 120 will be triggered to bypass the ESD current without damaging the power amplifier 210. Meanwhile, the voltage swing S of the output voltage $V_{out}$ is no longer limited by the ESD protection circuit 200, therefore rendering a perfect symmetrical waveform.

In comparison with the ESD protection circuit 100, while the positive ESD stress appears at the output pad $P_o$, the increased number of diodes $D_{p1}$~$D_{p5}$ in the diode string causes the diode string to have an increased turn-on resistance $R_d$ (or an increased conduction path length) and the NMOS transistor $T_N$ to have an increased turn-on time (this is because the turn-on time $t=R \times C_1$, where R denotes an equivalent resistance of the resistor $R_1$ and the turn-on resistor $R_d$ connected in series). This increases the probability that the ESD current flows to the power amplifier 210 and accordingly reduces the effectiveness of the protection provided by the clamping circuit 120 for the power amplifier 210.

SUMMARY OF THE INVENTION

In view of the above-mentioned problems, an object of the invention is to provide a voltage swing of an output voltage generated by a large-signal circuit and not limited by an ESD protection circuit which can dissipate an ESD swiftly by using a shortest conduction path if an ESD stress appears at an output pad.

The invention provides an ESD protection circuit for protecting an output circuit, comprising: a loading element coupled between an output terminal of the output circuit and a first operating voltage; a diode string having a plurality of diodes connected in series and coupled between the output terminal and the first operating voltage; a first clamping circuit coupled between the first operating voltage and a second operating voltage; and, a second clamping circuit, one terminal of the second clamping circuit coupled to the second operating voltage, and the other terminal of the second clamping circuit coupled to a first connecting node of a closest diode and a second closest diode to the output terminal among the diode string; wherein a number of the diodes in the diode string is greater than or equal to a voltage swing of the output terminal divided by a turn-on voltage of one of the diodes.

The invention also provides another ESD protection circuit for protecting an output circuit, both the output circuit and the ESD protection circuit coupled between a first operating voltage and a second operating voltage, the ESD protection circuit comprising: at least three diodes connected in series and coupled between the first operating voltage and the second operating voltage; a first clamping circuit coupled between the first operating voltage and the second operating voltage; and, a second clamping circuit coupled between the first operating voltage and a first node formed by the at least three diodes, in which a voltage of the first node is different from the first or second operating voltage; wherein the at least three diodes comprise a first group of diodes and a second group of diodes, the first group of diodes coupled between the first operating voltage and an output terminal of the output circuit, the second group of diodes coupled between the second operating voltage and the output terminal of the output circuit, and wherein a number of the first group of diodes is different from a number of the second group of diodes.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The ESD protection circuit and method thereof of the invention will be described with reference to the accompanying drawings.

In order for a voltage swing S of an output voltage $V_{out}$ generated by either a high-voltage output circuit or a large-signal circuit to get rid of the influence of an ESD protection circuit, a number M of diodes in the diode string of the ESD protection circuit is greater than or equal to the voltage swing S divided by the turn-on voltage of the diodes. Conventionally, the turn-on voltage of ordinary diodes is approximately 0.7V. As semiconductor-manufacturing technology advances, the turn-on voltage may vary and be not restricted to 0.7V.

Assuming that the voltage swing S of the output voltage $V_{out}$ generated by a large-signal circuit 310 is equal to 3V, in order for the voltage swing S of the output voltage $V_{out}$ to get rid of the influence of an ESD protection circuit, the number M of diodes in the diode string is greater than (3/0.7=4.3). In other words, the number M is greater than or equal to 5, i.e., requiring five or more diodes. Hereinafter, for an explanation, a first and a second embodiments of the invention are described with S=3V, M=5.

Figure 3A:
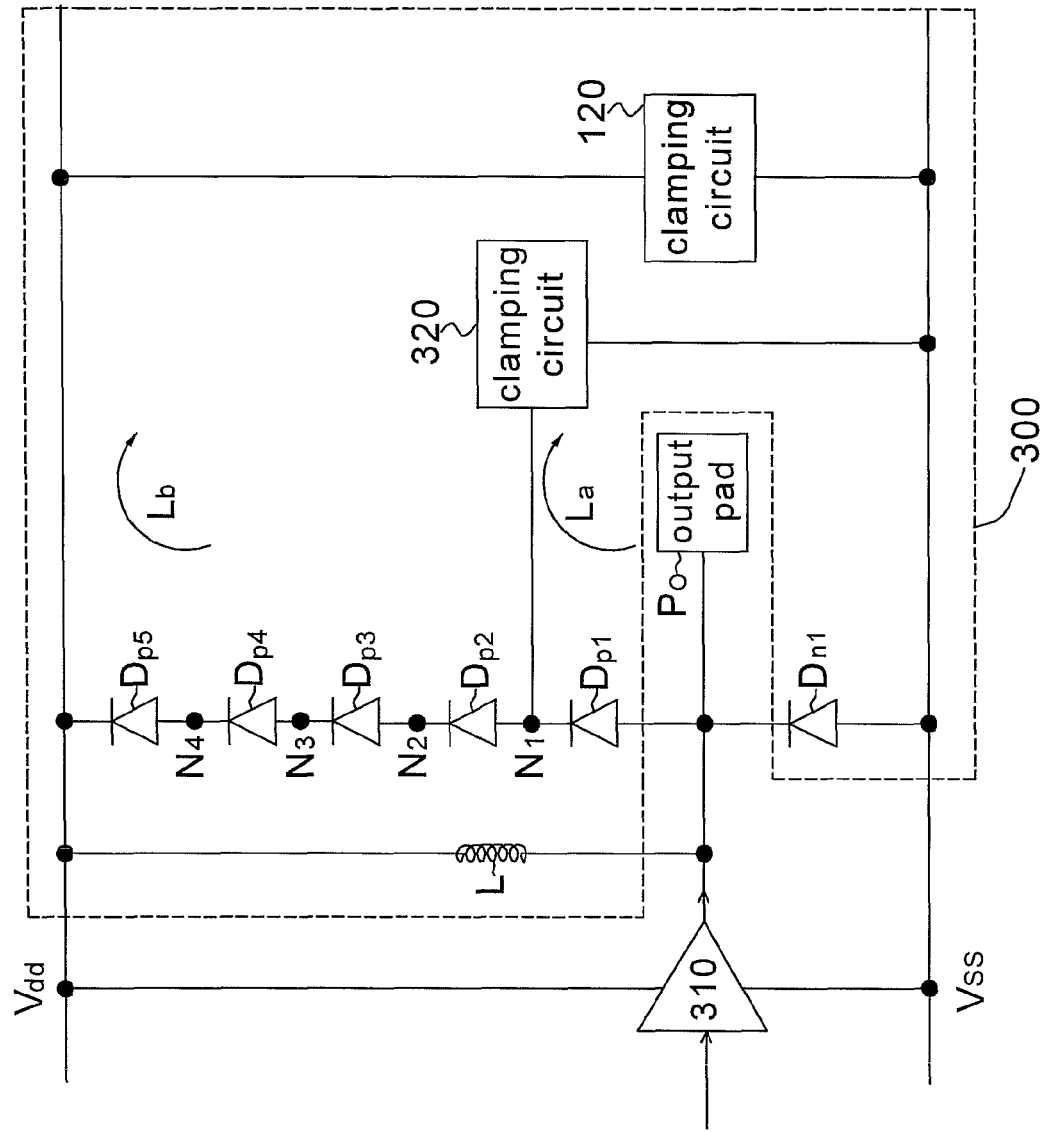
FIG. 3A is a schematic circuit diagram showing a first embodiment of the invention.

FIG. 3A is a schematic circuit diagram showing a first embodiment of the invention. According to the first embodiment of the invention, an ESD protection circuit 300, installed at the output terminal of a (radio-frequency) large-signal circuit 310, includes two clamping circuits 120, 320, an inductor L, a diode $D_{n1}$ and a diode string $D_{p1}$~$D_{p5}$. The diode $D_{n1}$ has its cathode coupled to the output pad $P_o$ and its anode coupled to the second operating voltage VS, whereas the diode string $D_{p1}$~$D_{p5}$ has its anode coupled to the output pad $P_o$ and its cathode coupled to the first operating voltage $V_{dd}$. The implementation of the clamping circuits 120, 320 is well known to those skilled in the art and thus will not be described herein.

Figure 1A:
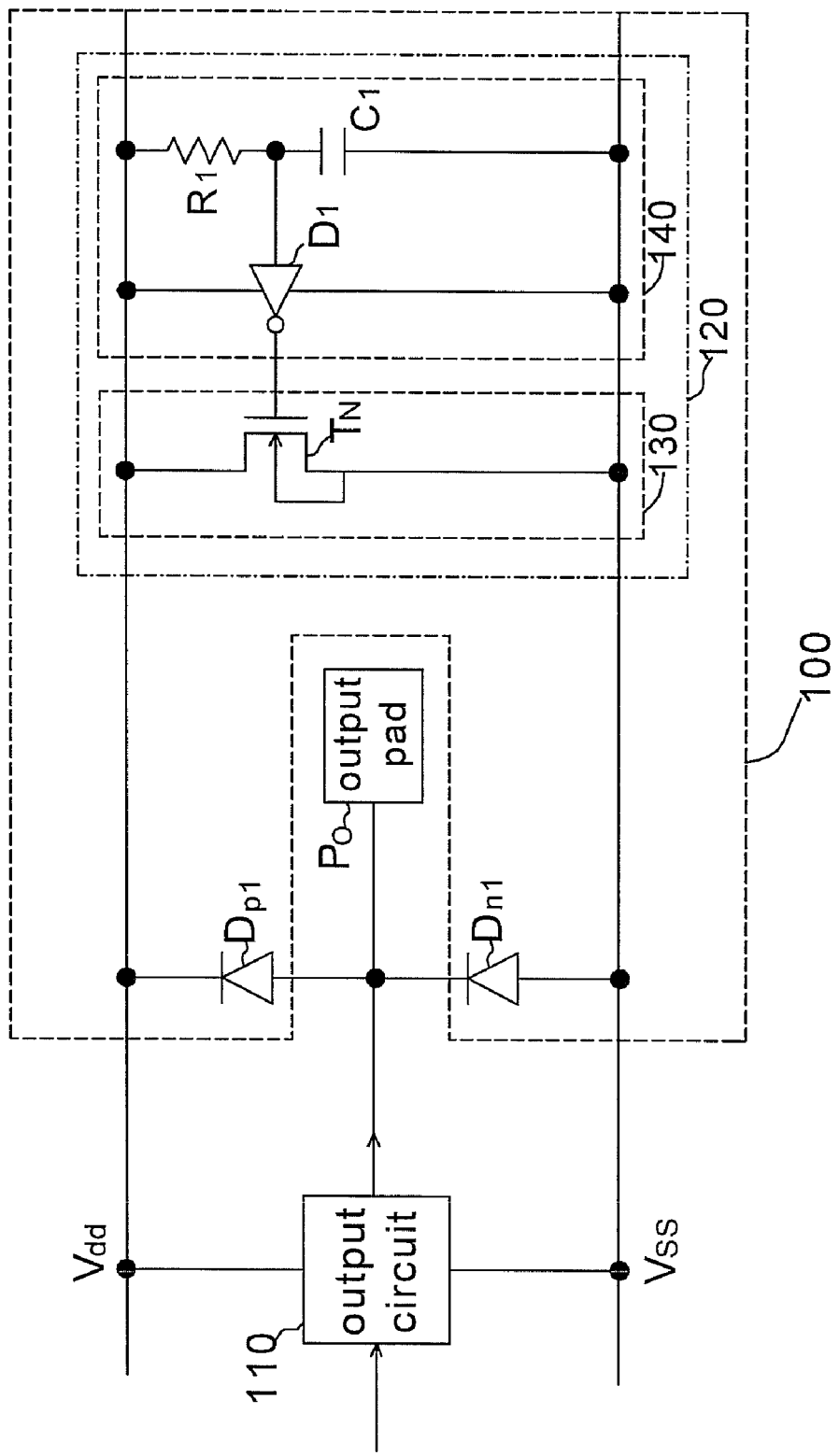
FIG. 1A is a schematic circuit diagram of a conventional ESD protection circuit.
Figure 1B:
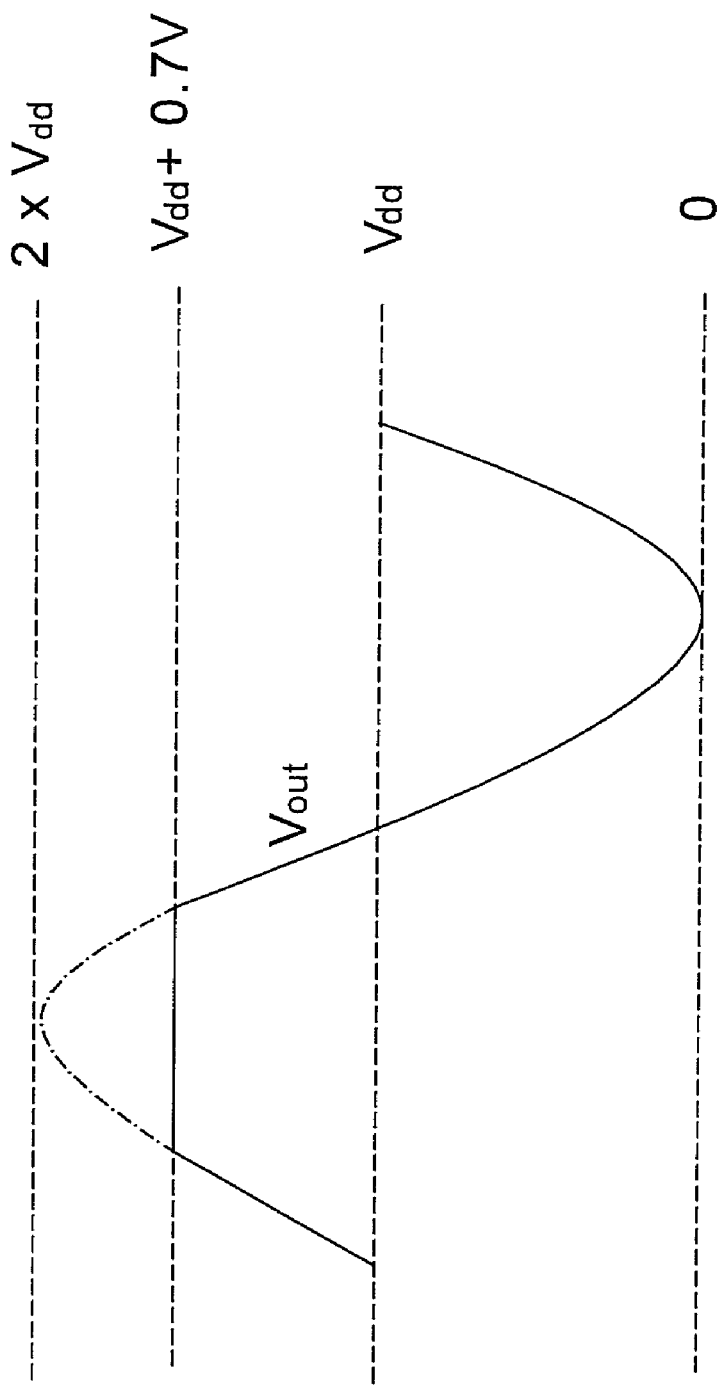
FIG. 1B shows an output voltage waveform measured at an output pad shown in FIG. 1 while a voltage swing S is greater than 0.7V.
Figure 2:
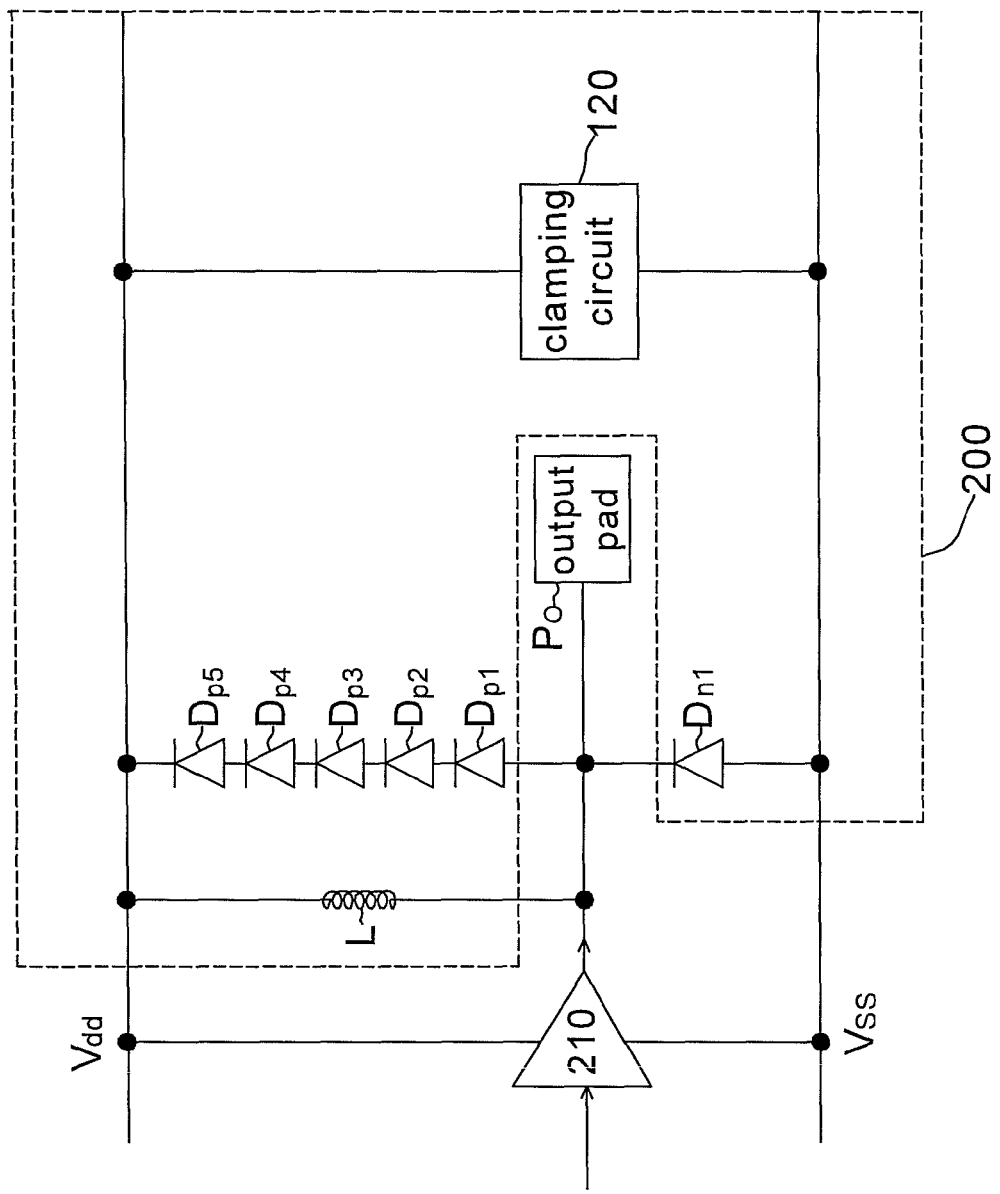
FIG. 2 is a schematic circuit diagram of another conventional ESD protection circuit.

Comparing FIG. 2 with FIG. 3A, besides the clamping circuit 120 coupled between the first operating voltage $V_{dd}$ and the second operating voltage $V_{ss}$, the clamping circuit 320 of FIG. 3A is additionally installed between a connecting node $N_1$ of diodes $D_{p1}$, $D_{p2}$ and the second operating voltage $V_{ss}$. During human body model (HBM) ESD testing and machine model (MM) ESD testing, in terms of four ESD stressing modes (PS, NS, PD, ND), when a positive ESD stress (in PS mode) with respect to the second operating voltage $V_{ss}$ appears at the output pad $P_o$ and the magnitude of the positive ESD stress is large enough to switch on the five diodes $D_{p1}$~$D_{p5}$, most of the ESD current is dissipated to the second operating voltage $V_{ss}$ through the clamping circuit 320 since a loop La (i.e., $P_o \Rightarrow D_{p1} \Rightarrow$ clamping circuit $320 \Rightarrow V_{ss}$) has a shorter conduction path (or a less turn-on resistance $R_{da}$, causing the NMOS transistor $T_N$ to have an shorter turn-on time $t_a$). Meanwhile, since a loop $L_b$ (i.e., $P_o \Rightarrow D_{p1} \Rightarrow D_{p2} \Rightarrow D_{p3} \Rightarrow D_{p4} \Rightarrow D_{p5} \Rightarrow$ clamping circuit $120 \Rightarrow V_{ss}$) has a longer conduction path (or a greater turn-on resistance $R_{db}$, causing the NMOS transistor $T_N$ to have an longer turn-on time $t_b$), a small part of the ESD current is dissipated to the second operating voltage $V_{ss}$ through the clamping circuit 120. As can be seen, the installation of the clamping circuit 320 gains the effects of reducing the conduction path length and dissipating the ESD current swiftly, which significantly increases the effectiveness of the protection for the (RF) large-signal circuit 310. It should be noted that the clamping circuits 120, 320 have high impedances during normal circuit operation (no ESD events) so that the circuit performance is not affected during normal circuit operation.

The other three ESD stressing modes (NS, PD, ND) will be discussed as follows. In NS mode ($V_{ss}$ is grounded, $V_{dd}$ is floated and a negative ESD stress is applied to $P_o$ with respect to $V_{ss}$) and PD mode ($V_{dd}$ is grounded, $V_{ss}$ is floated and a positive ESD stress is applied to $P_o$ with respect to $V_{dd}$), the clamping circuits 120, 320 fail to achieve any desired effect. In ND mode ($V_{dd}$ is grounded, $V_{ss}$ is floated and a negative ESD stress is applied to $P_o$ with respect to $V_{dd}$), the diode $D_{n1}$ is switched on, the clamping circuit 120 bears the responsibility of protecting the (RF) large-signal circuit 310, but the clamping circuit 320 does not achieve any desired effect. On the whole, the clamping circuits 120, 320 in PS mode give the most effective protection to the (RF) large-signal circuit 310.

Figure 3B:
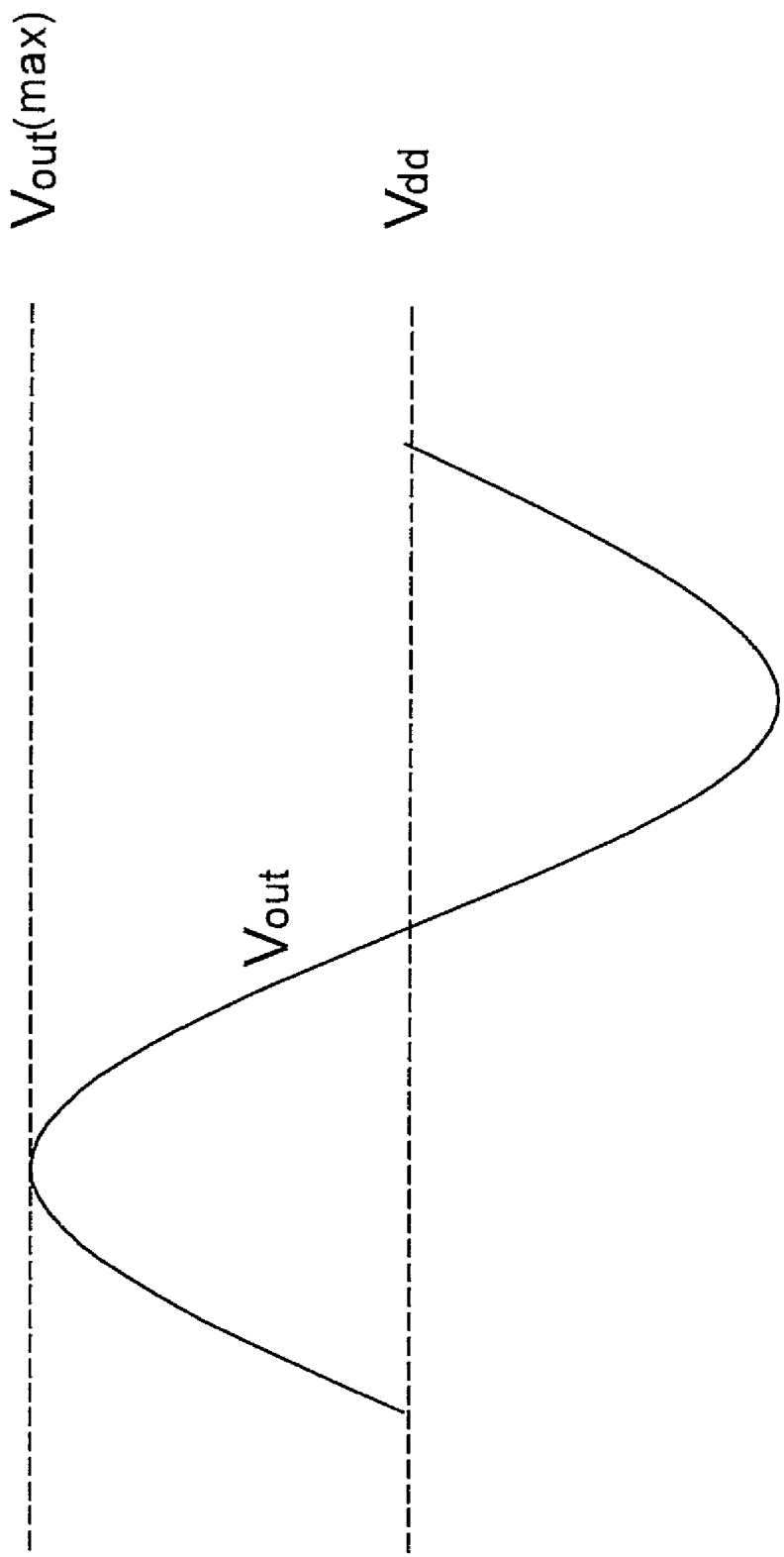
FIG. 3B shows an output voltage waveform measured at the output pad shown in FIG. 3A.

In the first embodiment, the last stage of the (RF) large-signal circuit 310 is either a NMOS transistor (not shown) with its drain connected to the output pad $P_o$ or a NPN bipolar transistor (not shown) with its collector connected to the output pad $P_o$. In addition, the inductor L is coupled between the first operating voltage $V_{dd}$ and the output pad $P_o$ so as to increase the circuit bandwidth and pull the output DC voltage level up to $V_{dd}$. In view that the number M of diodes in the diode string is equal to five, the voltage swing S (=3V) of the output voltage $V_{out}$ is no longer limited by the ESD protection circuit 300, therefore rendering a perfect symmetrical waveform as shown in FIG. 3B. On condition that the output voltage $V_{out}$ greater than ($V_{dd}$+3.5V) is caused by voltage spikes generated at the output terminal of the (RF) large-signal circuit 310, the output voltage $V_{out}$ will be clipped at ($V_{dd}$+3.5V) so that the maximum output voltage $V_{out}$ at the output pad $P_o$ is no more than ($V_{dd}$+3.5V).

Figure 4A:
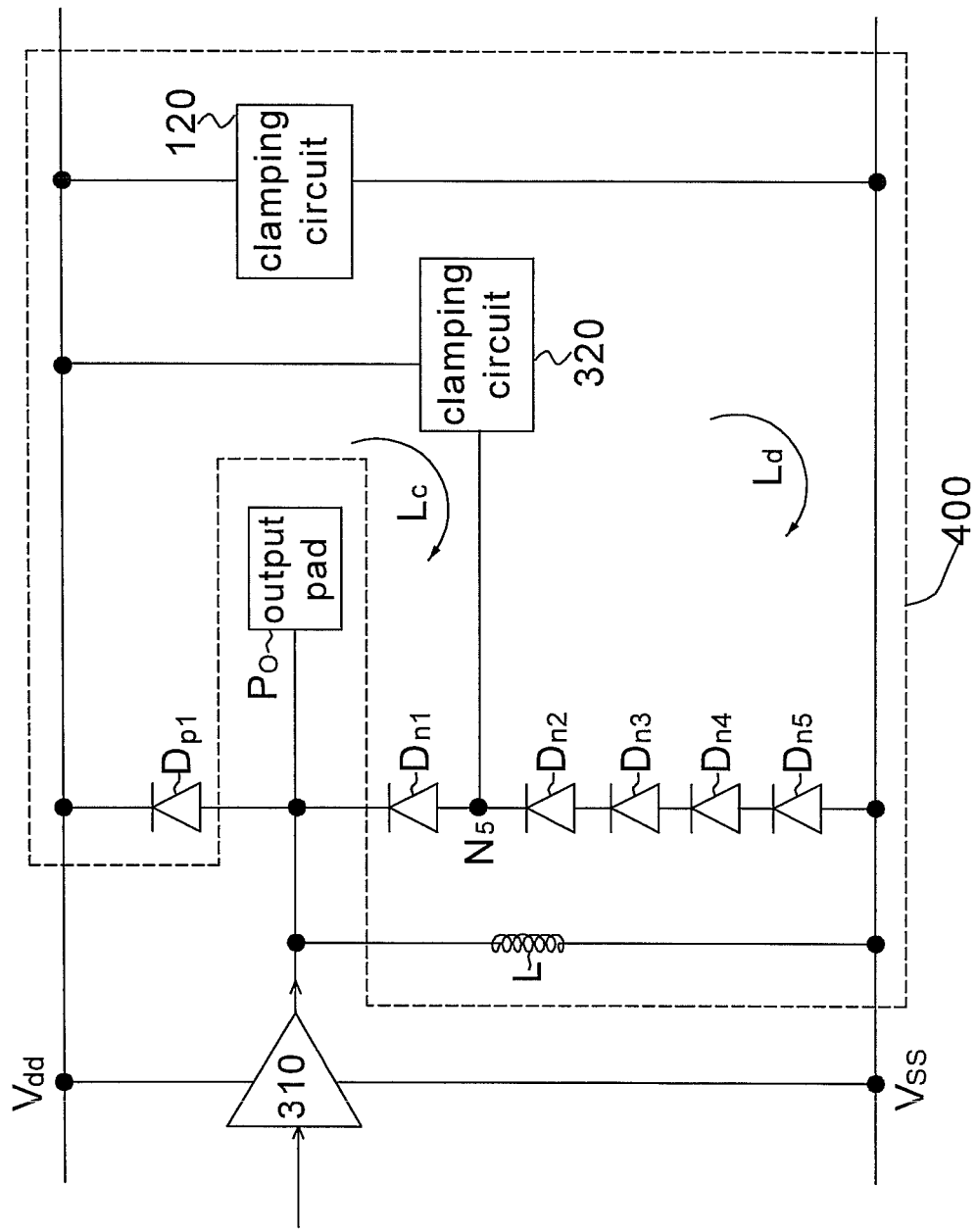
FIG. 4A is a schematic circuit diagram showing a second embodiment of the invention.

FIG. 4A is a schematic circuit diagram showing a second embodiment of the invention. According to the second embodiment of the invention, an ESD protection circuit 400 comprises two clamping circuits 120, 320, an inductor L, a diode $D_{p1}$ and a diode string $D_{n1}$~$D_{n5}$. Since the operations of the second embodiment are similar to those of the first embodiment, repeated description is omitted herein. The last stage of the (RF) large-signal circuit 310 is either a PMOS transistor (not shown) with its drain connected to the output pad $P_o$ or a PNP bipolar transistor (not shown) with its collector connected to the output pad $P_o$. In addition, the inductor L is coupled between the second operating voltage $V_{ss}$ and the output pad $P_o$ so as to increase the circuit bandwidth and pull the output DC voltage level down to $V_{ss}$.

In the second embodiment, besides the clamping circuit 120 coupled between the first operating voltage $V_{dd}$ and the second operating voltage $V_{ss}$, the clamping circuit 320 is additionally installed between a connecting node $N_5$ of the diodes $D_{n1}$, $D_{n2}$ and the first operating voltage $V_{dd}$. During HBM ESD testing and MM ESD testing, in terms of four ESD stressing modes (PS, NS, PD, ND), when a negative ESD stress (in ND mode) with respect to the first operating voltage $V_{dd}$ appears at the output pad $P_o$ and the magnitude of the negative ESD stress is large enough to switch on the five diodes $D_{n1}$~$D_{n5}$, most of the EDS current is dissipated to the second operating voltage $V_{ss}$ through the clamping circuit 320 since a loop $L_c$ (i.e., $V_{dd}$⇒clamping circuit 320⇒$D_{p1}$⇒$P_o$) has a shorter conduction path (or a less turn-on resistance $R_{dc}$, causing the NMOS transistor $T_N$ to have an shorter turn-on time $t_c$). Meanwhile, since a loop $L_d$ (i.e., $V_{dd}$⇒clamping circuit 120⇒$V_{ss}$⇒$D_{n5}$⇒$D_{n4}$⇒$D_{n3}$⇒$D_{n2}$⇒$D_{n1}$⇒$P_o$) has a longer conduction path (or a greater turn-on resistance $R_{dd}$, causing the NMOS transistor $T_N$ to have an longer turn-on time $t_d$), a small part of the ESD current is dissipated to the second operating voltage $V_{ss}$ through the clamping circuit 120. As can be seen, the installation of the clamping circuit 320 gains the effects of shortening the conduction path length and dissipating the ESD current swiftly, which significantly increases the effectiveness of the protection for the (RF) large-signal circuit 310.

The other three ESD stressing modes (PS, NS, PD) will be discussed as follows. In NS mode and PD mode, the clamping circuits 120, 320 fail to achieve any desired effect. In PS mode, the diode $D_{p1}$ is switched on, the clamping circuit 120 bears the responsibility of protecting the (RF) large-signal circuit 310, but the clamping circuit 320 does not achieve any desired effect. On the whole, the clamping circuits 120, 320 in ND mode give the most effective protection to the (RF) large-signal circuit 310 according to the second embodiment.

Figure 4B:
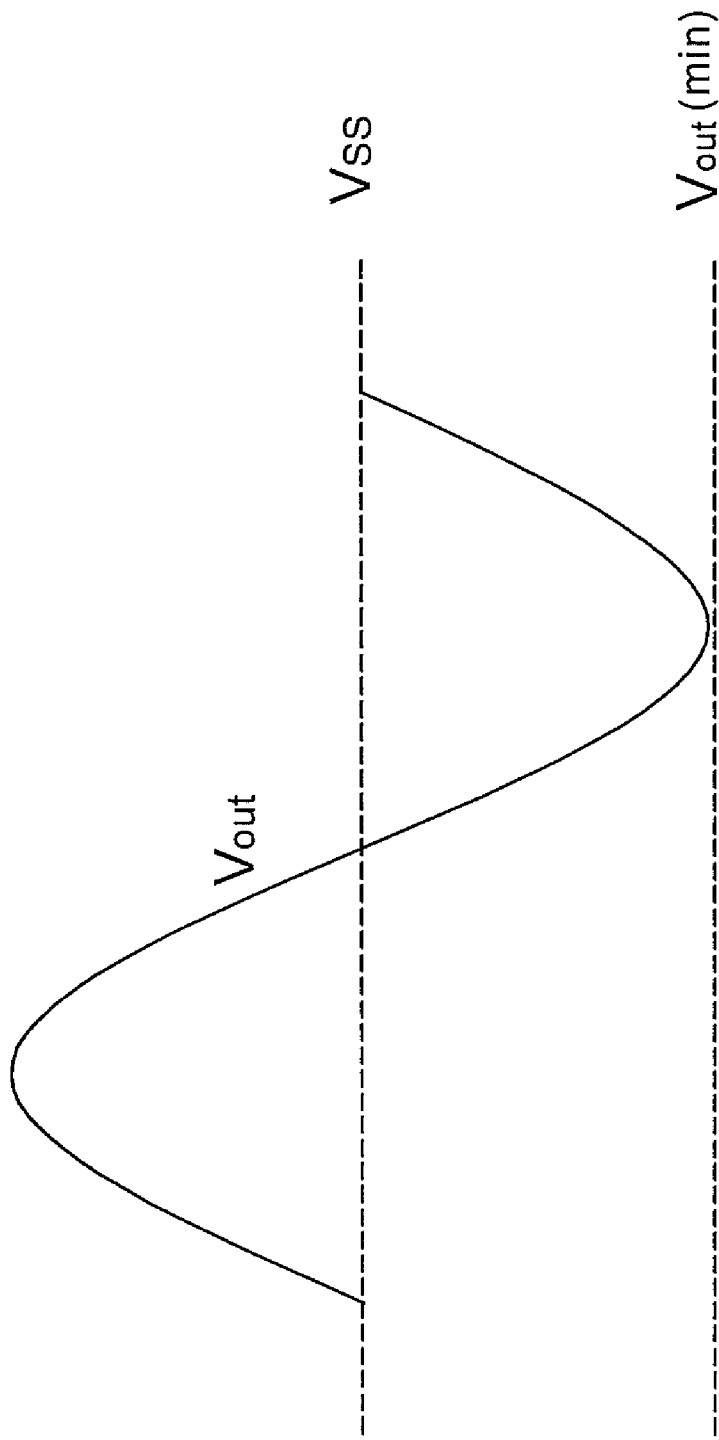
FIG. 4B shows an output voltage waveform measured at the output pad shown in FIG. 4A.

In the second embodiment, the voltage swing S (=3V) of the output voltage $V_{out}$ is no longer limited by the ESD protection circuit 400, therefore rendering a perfect symmetrical waveform as shown in FIG. 4B.

A feature of the invention is that the ESD conduction path length is reduced in order to dissipating the ESD current swiftly. Although there are only two clamping circuits 120, 320 installed in the first and the second embodiments, more clamping circuits are allowed to be respectively installed between each connecting node of two arbitrary adjacent diodes in the diode string and the second operating voltage $V_{ss}$ if the circuit size and the hardware cost are acceptable. Take the first embodiment for example. Three additional clamping circuits (not shown) are allowed to be installed respectively between a connecting node $N_2$ of the diodes $D_{p2}$, $D_{p3}$ and the second operating voltage $V_{ss}$, a connecting node $N_3$ of the diodes $D_{p3}$, $D_{p4}$ and the second operating voltage $V_{ss}$, and a connecting node $N_4$ of the diodes $D_{p4}$, $D_{p5}$ and the second operating voltage $V_{ss}$. If an ESD stress occurs at the output pad $P_o$, the first embodiment with the five clamping circuits will dissipate the EDS current most swiftly. Thus, in terms of the first embodiment, it would be within the scope of the invention to have at least one clamping circuit installed between the diode string and the second operating voltage $V_{ss}$. Likewise, in terms of the second embodiment, it would be within the scope of the invention to have at least one clamping circuit installed between the diode string and the first operating voltage $V_{dd}$.

Please be noted that the inductor L in both the first and the second embodiments can be substituted by a resistor, which is able to achieve the object and the effect of the invention as well. Besides, although the aforementioned two embodiments describe a case of a series-connected diode string, the diode string is not limited to a series configuration but includes other configurations, as the diode string may be modified and practiced in different but equivalent manners apparent to those skilled in the art having the benefit of the teachings herein. Further, although the ESD protection circuit is installed at the output terminal of the large-signal circuit in the aforementioned two embodiments, the invention is applicable to all high-power output circuits, all high-voltage output circuits and all power amplifiers in practical applications.

Figure 5:
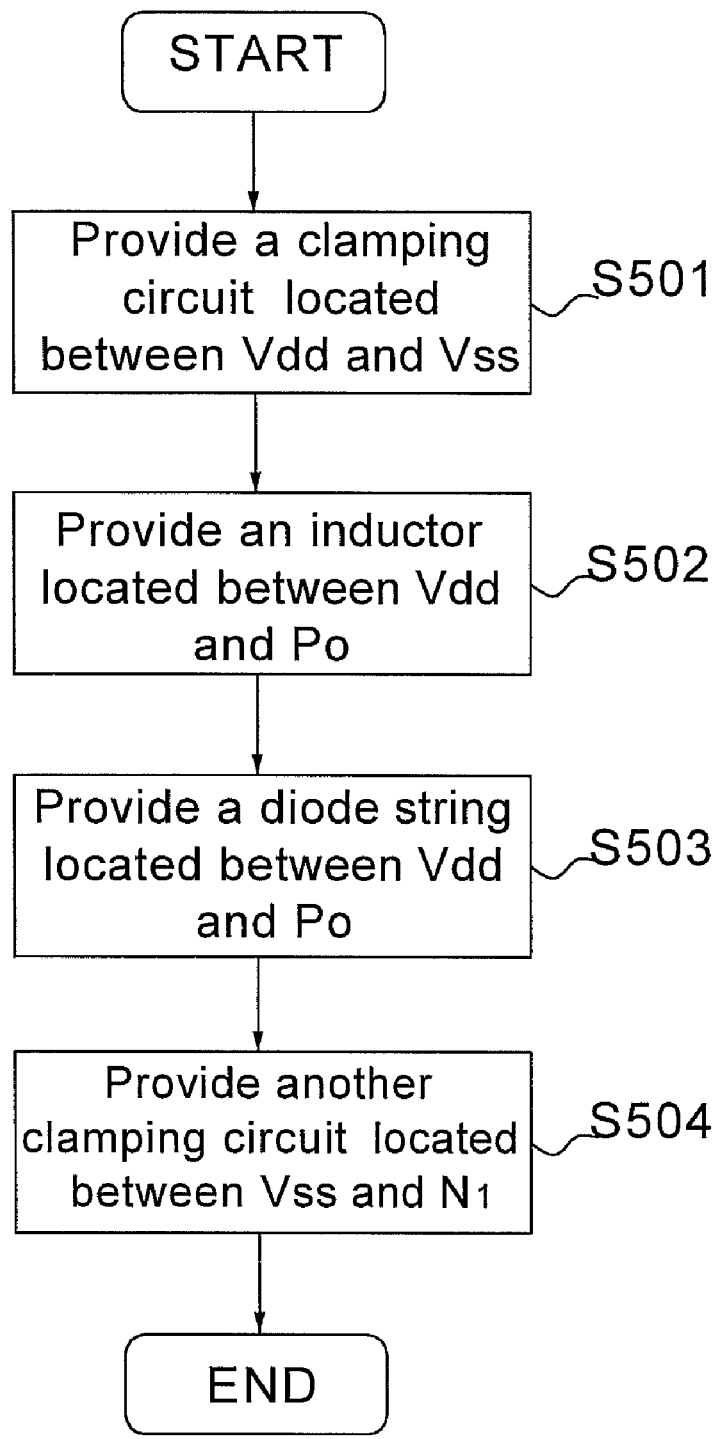
FIG. 5 is a flow chart illustrating an ESD protection method according to the invention.

FIG. 5 is a flow chart illustrating an ESD protection method according to the invention. The ESD protection method in accordance with FIGS. 3A and 5 is detailed as follows.

Step S501: Providing a clamping circuit 120 located between the first operating voltage $V_{dd}$ and the second operating voltage $V_{ss}$.

Step S502: Providing an inductor L located between the first operating voltage $V_{dd}$ and the output pad $P_o$.

Step S503: Providing a diode string located between the first operating voltage $V_{dd}$ and the output pad $P_o$.

Step S504: Providing another clamping circuit 320 located between the connecting node $N_1$ of the diodes $D_{p1}$, $D_{p2}$ and the second operating voltage $V_{ss}$ in order to reduce the conduction path length of the ESD stress, therefore dissipating the ESD current swiftly.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An electrostatic discharge (ESD) protection circuit for protecting an output circuit, comprising:
    a loading element coupled between an output terminal of the output circuit and a first node carrying a first operating voltage;
    a first plurality of diodes connected in series and forming a diode string and coupled between the output terminal and the first node;
    a first clamping circuit coupled between the first node and a second node carrying a second operating voltage;
    a second clamping circuit, one terminal of the second clamping circuit coupled to the second node, and the other terminal of the second clamping circuit coupled to a first connecting node of a closest diode and a second closest diode to the output terminal among the diode string; and
    a third clamping circuit, one terminal of the third clamping circuit coupled to the second node, and the other terminal of the third clamping circuit coupled to a second connecting node between two adjacent diodes in the diode string other than the two adjacent diodes that connect to form the first connecting node, wherein a number of the diodes in the diode string is greater than or equal to three;
    wherein a number of the diodes in the diode string is greater than or equal to a voltage swing of the output terminal divided by a turn-on voltage of one of the diodes.

2. The ESD protection circuit of claim 1, wherein the loading element is selected from the group consisting of a resistor and an inductor.

3. The ESD protection circuit of claim 1, further comprising:
    a diode coupled between the output terminal and the second node.

4. The ESD protection circuit of claim 1, wherein the output circuit is selected from the group consisting of a large-signal circuit and a power amplifier.

5. The ESD protection circuit of claim 1, further comprising a second plurality of diodes, wherein the second plurality of diodes comprises the diode string and a group of diodes, the group of diodes coupled between the second node and the output terminal of the output circuit, and wherein a number of the diodes in the diode string is different from a number of diodes in the group of diodes.

6. The ESD protection circuit of claim 1, wherein the second clamping circuit comprises at least a MOS (metal oxide semiconductor) transistor having source and drain nodes connecting the MOS transistor between the first connecting node and the second node, the second clamping circuit further comprising a resistor and a capacitor that are series connected between the first connecting node and the second node, the second clamping circuit further comprising an inverter connected between a node connecting the resistor and the capacitor and a gate node of the MOS transistor.

7. An electrostatic discharge (ESD) protection circuit for protecting an output circuit, both the output circuit and the ESD protection circuit coupled between a first node carrying a first operating voltage and a second node carrying a second operating voltage, the ESD protection circuit comprising:
 a plurality of diodes comprising at least three diodes connected in series and coupled between the first node and the second node, wherein the plurality of diodes comprise a first group of diodes and a second group of diodes, the first group of diodes coupled between the first node and an output terminal of the output circuit, the second group of diodes coupled between the second node and the output terminal of the output circuit, and wherein a number of the first group of diodes is different from a number of the second group of diodes;
 a first clamping circuit coupled between the first node and the second node;
 a second clamping circuit coupled between the first node and a first connecting node formed by two of the plurality of diodes, wherein the first connecting node is different from the output terminal, the first node, and the second node; and
 a third clamping circuit, coupled between the first node and a third connecting node formed by two adjacent diodes of the plurality of diodes, wherein the third connecting node is different from all nodes of the group consisting of: the first node, the second node, the output terminal, and the first connecting node.

8. The ESD protection circuit of claim 7, further comprising:
 a loading element coupled between the output terminal and either of the first node or the second node.

9. The ESD protection circuit of claim 8, wherein the loading element is selected from the group consisting of a resistor and an inductor.

10. The ESD protection circuit of claim 7, wherein the output terminal is coupled to a second connecting node formed by the plurality of diodes and the second connecting node is different from any of the first node, the second node, and the first connecting node.

11. The ESD protection circuit of claim 7, wherein the first operating voltage is different from the second operating voltage.

12. The ESD protection circuit of claim 7, wherein the output circuit is selected from the group consisting of a large-signal circuit and a power amplifier.

13. The ESD protection circuit of claim 7, wherein a number of the diodes is selected to be greater than or equal to a voltage swing of the output terminal divided by a turn-on voltage of one of the diodes.

14. The ESD protection circuit of claim 7, wherein the second clamping circuit comprises at least a MOS (metal oxide semiconductor) transistor having source and drain nodes connecting the MOS transistor between the first connecting node and the first node, the second clamping circuit further comprising a resistor and a capacitor that are series connected between the first connecting node and the first node, the second clamping circuit further comprising an inverter connected between a node connecting the resistor and the capacitor and a gate node of the MOS transistor.

* * * * *